(12) United States Patent
Seeley

(10) Patent No.: US 11,859,725 B2
(45) Date of Patent: Jan. 2, 2024

(54) GAS PURGED VALVE

(71) Applicant: Edwards Limited, Burgess Hill (GB)

(72) Inventor: Andrew James Seeley, Clevedon (GB)

(73) Assignee: Edwards Limited, West (GB)

( * ) Notice: Subject to any disclaimer, the term of this patent is extended or adjusted under 35 U.S.C. 154(b) by 0 days.

(21) Appl. No.: 17/776,418

(22) PCT Filed: Nov. 12, 2020

(86) PCT No.: PCT/GB2020/052881
§ 371 (c)(1),
(2) Date: May 12, 2022

(87) PCT Pub. No.: WO2021/094759
PCT Pub. Date: May 20, 2021

(65) Prior Publication Data
US 2022/0403942 A1  Dec. 22, 2022

(30) Foreign Application Priority Data
Nov. 13, 2019 (GB) ...................... 1916476

(51) Int. Cl.
*F16K 27/06*    (2006.01)
*F16K 37/00*    (2006.01)
(Continued)

(52) U.S. Cl.
CPC ...... *F16K 27/067* (2013.01); *C23C 16/45561* (2013.01); *F16K 5/0207* (2013.01);
(Continued)

(58) Field of Classification Search
CPC .. F16K 11/085; F16K 27/067; F16K 11/0873; F16K 11/0876; F16K 11/087;
(Continued)

(56) References Cited

U.S. PATENT DOCUMENTS 5,538,702 A   7/1996 Smith et al.
7,494,633 B2  2/2009 Stanton et al.
(Continued)

FOREIGN PATENT DOCUMENTS

EP   0489678 A1   6/1993

OTHER PUBLICATIONS

British Examination Report dated Feb. 11, 2020 and Search Report dated Feb. 10, 2020 for corresponding British Application No. GB1916476.3, 6 pages.
(Continued)

*Primary Examiner* — Atif H Chaudry
(74) *Attorney, Agent, or Firm* — Theodore M. Magee; Westman, Champlin & Koehler, P.A.

(57) ABSTRACT

A valve includes a housing with at least one inlet and at least one outlet; a valve member located within the housing and being moveable between different positions for controlling, in use, the flow of a fluid from an inlet to an outlet of the valve; wherein the valve further includes at least two spaced-apart valve seats in which the valve member is seated so as to form a cavity bounded by the valve seats, an exterior surface of the valve member and an interior surface of the housing; a first conduit extending between the exterior of the housing and the cavity; and a second conduit extending between the cavity and a bore of the valve member, through which conduits, in use, a purge gas can be introduced into the cavity and bore.

14 Claims, 8 Drawing Sheets

(51) Int. Cl.
  *F16K 11/087* (2006.01)
  *F16K 11/085* (2006.01)
  *C23C 16/455* (2006.01)
  *F16K 5/02* (2006.01)

(52) U.S. Cl.
  CPC .......... *F16K 11/085* (2013.01); *F16K 11/087* (2013.01); *F16K 11/0853* (2013.01); *F16K 11/0873* (2013.01); *F16K 11/0876* (2013.01); *F16K 37/005* (2013.01); *F16K 2200/30* (2021.08)

(58) Field of Classification Search
  CPC . F16K 11/0853; F16K 51/02; C23C 16/45561

See application file for complete search history.

(56) References Cited

U.S. PATENT DOCUMENTS

| | | |
|---|---|---|
| 2005/0109399 A1* | 5/2005 | Wodjenski .............. F17C 13/04 137/240 |
| 2005/0217732 A1 | 10/2005 | Tollner |
| 2010/0038362 A1 | 2/2010 | Sasaki et al. |
| 2011/0260090 A1 | 10/2011 | Jones |
| 2014/0366953 A1 | 12/2014 | Lee et al. |

OTHER PUBLICATIONS

PCT Notification of Transmittal of the International Preliminary Report on Patentability dated Jan. 26, 2021 and International Search Report dated Jan. 26, 2021 for corresponding PCT application Serial No. PCT/GB2020/052881, 6 pages.

PCT Written Opinion of the International Search Authority dated Jan. 26, 2021 for corresponding PCT application Serial No. PCT/GB2020/052881, 6 pages.

* cited by examiner

1

GAS PURGED VALVE

CROSS-REFERENCE TO RELATED APPLICATION

This application is a Section 371 National Stage Application of International Application No. PCT/GB2020/052881, filed Nov. 12, 2020, and published as WO 2021/094759 A1 on May 20, 2021, the content of which is hereby incorporated by reference in its entirety and which claims priority of British Application No. 1916476.3, filed Nov. 13, 2019.

FIELD

This invention relates to valves, and in particular, but without limitation, to gas purged valves that, in the event of a valve failure, substantially reduce or eliminate the release of corrosive, toxic, pyrophoric and/or hazardous gases into the surrounding environment. The invention also relates to a system having a vacuum pump, a gas abatement system and a gas purged valve according to the present invention.

BACKGROUND

The manufacture of semiconductor devices, flat panel displays and solar panels involves various process steps (e.g. etching, deposition and cleaning) typically performed under vacuum conditions. To achieve such conditions, one or more vacuum pumps are connected to the outlet of each process chamber. During operation, the vacuum pumps receive unused process gases and/or by-products exiting the process chamber. The unused gases and by-products are usually corrosive, toxic, pyrophoric and/or hazardous gases that cannot be released directly into the environment. Thus, each vacuum pump exhausts into one or more gas abatement systems.

Manufacturers commonly install two abatement systems in parallel, one system operating in an "on-line" mode and the other system operating in an "off-line" mode. Together, the dual systems provide enhanced uptime should an abatement system fail or require preventative maintenance. During such failure or maintenance, an isolation valve isolates the off-line system from the on-line system. Each inlet line to each abatement system includes an isolation valve that alternately switches between the on-line and the off-line abatement systems. Because of unused process gases and by-products flowing through the isolation valve, the valve's o-ring seals or valve seats can fail. Such failure can cause the pressurized gases to continue flowing into the off-line abatement system even after the isolation valve is "closed." Thus, when a technician is servicing the off-line system, corrosive, pyrophoric, toxic and/or hazardous gases may be released into the environment, detrimentally harming the surrounding people and property.

To minimize release of gases, manufacturers often include a second, manually operated isolation valve in both the on-line and off-line abatement systems' inlet lines. Prior to servicing the off-line abatement system, the technician must also close the manual valve to ensure that pressurized gas no longer flows into the system. However, technicians sometimes forget to close or reopen the manual valve. Thus, the addition of a manual valve can have several disadvantages. First, the addition of a second valve adds cost to the system. Second, even with the second manual valve, there remains a small risk of accidental exposure, should the ball or seals of the manual valve become damaged. Third, if a technician forgets to reopen the manual valve, for example, then when the primary system goes off-line and switches to the secondary system, a catastrophic failure in the process system would occur.

Thus, there is a need for a single, reliable isolation valve that can isolate an off-line abatement system from an on-line abatement system and substantially reduce or eliminate release of corrosive, toxic, pyrophoric and/or hazardous gases. Similarly, there is a need for a processing system that provides cost-effective redundancy and enhanced safety.

The discussion above is merely provided for general background information and is not intended to be used as an aid in determining the scope of the claimed subject matter. The claimed subject matter is not limited to implementations that solve any or all disadvantages noted in the background.

SUMMARY

According to a first aspect of the invention, there is provided a valve comprising: a housing with at least one inlet and at least one outlet; a valve member located within the housing and being moveable between different positions for controlling, in use, the flow of a fluid from an inlet to an outlet of the valve; wherein the valve further comprises: at least two spaced-apart valve seats in which the valve member is seated so as to form a cavity bounded by the valve seats, an exterior surface of the valve member and an interior surface of the housing; a first conduit extending between the exterior of the housing and the cavity; and a second conduit extending between the cavity and a bore of the valve member, through which conduits, in use, a purge gas can be introduced into the cavity and bore.

Preferably, pressurized gas or purge gas can optionally, but preferably be introduced into the cavity to ensure that process gas cannot escape the housing. In certain circumstances, this may involve providing a continuous flow of purge gas into the cavity or bore to maintain a positive pressure within the cavity or to inhibit backflow or the escape of process gas out of the housing via either aperture.

One envisaged advantage of the invention is that it may provide protection to people and the environment surrounding the valve in the event of dysfunction or failure. This can be achieved by providing a way to purge potentially harmful gasses from the valve and replace them with a (preferably) inert or harmless purge gas such that, should the valve leak, fail or be incorrectly operated, it is more likely that inert or harmless purge gas will escape than potentially harmful process gasses. This is achieved, in practice, by surrounding the moveable valve member with a continuous supply of purge gas, and by allowing the purge gas to enter the valve member's bore.

Advantageously, the second conduit extending between the cavity and a bore of the valve member allows, in a first ("on") position, i.e. when the bore aligns with an inlet and an outlet of the valve, a purge gas to enter the cavity and the bore of the valve member. Thus, the risk of a process gas escaping the housing may be reduced whilst the valve is in the first position. This is because purge gas may be allowed to flow from a flow path and into the cavity and, from the cavity, the purge gas may flow through the second conduit into the bore of the valve member where the purge gas combines with a process gas before exiting the valve. The purge gas may be supplied at a greater pressure than the normal maximum pressure of the process gas so that the purge gas may flow into the process gas stream.

The valve can be an isolator valve or a diverter valve, as may be used in a vacuum system with redundant gas abatement systems. In the case of an isolator valve, the valve member may comprise a bore such that the bore aligns with an inlet and an outlet of the valve when moved or rotated to the first position, and/or such that the bore does not align with either an inlet or an outlet when it is moved or rotated to the second position. Of course, when the valve member is moved to the second ("off") position, the purge gas may be dead-headed.

In the case of a diverter valve, the valve member may be moveable or rotatable between first and second positions such that the bore aligns with an inlet and a first outlet in the first position and an inlet and a second outlet in the second position.

To inhibit or prevent purge gas from flowing back out of the housing, a non-return valve is preferably provided. The non-return valve may comprise a spring, whose tension may be adjustable, and which spring is preferably manufactured from an alloy having a high nickel content, such as a mnemonic (or "shape-memory") alloy, such as Nitinal™.

In order to facilitate the introduction of the purge gas into the valve, a manifold may be provided to enable the purge gas to be introduced into the purge gas conduit from outside the housing.

A heater, such as a suitably specified cartridge heater, may be provided to heat the manifold and hence the purge gas within the manifold prior to entering the cavity. Such an arrangement may inhibit or prevent condensation within the manifold or any part of the valve.

The manifold, where provided, may function as a heat exchanger for transferring heat from the heater or cartridge heater to the purge gas within it. In order to maximize the efficiency of heat exchange, the manifold is preferably manufactured from a high thermal conductivity material, such as copper or aluminum alloy. The heat transfer from the heater or cartridge heater may be maximized by engineering the flow path for purge gas within the manifold to have a large surface area and to follow a non-linear path. As such, the flow path of purge gas through the manifold is preferably disrupted, which can be accomplished by increasing turbulence of the purge gas flowing through it, a tortuous flow path for purge gas flowing through the manifold, baffles in the flow path and the appropriate use of a packing material.

In most practical situations, there is preferably a purge gas supply, which is connected to an inlet of the manifold.

As alluded to previously, it may be possible to check the integrity of the valve by monitoring the pressure or flow of the purge gas in any one or more of the group comprising: the cavity; the first and second conduits; the manifold; and the purge gas supply. This can be achieved, in certain situations, by using a pressure transducer or a flow transducer. In a most preferred embodiment of the invention, the pressure transducer is positioned within the purge gas supply, and a valve and a pressure regulator are provided upstream of the pressure transducer along with a valve for isolating the purge gas within the cavity and the manifold, the pressure transducer being adapted to monitor the pressure of the isolated purge gas.

In order to be compatible with the manufacturing processed described previously, the wetted components are preferably selected for compatibility with the process gasses flowing through the valve, such as fluorine, chlorine and hydrogen bromine. In a similar manner, the valve seats are also preferably manufactured from materials that are resistant to chemical and physical attack by the process gasses, such as, for example, stainless steel, Hasteloy™, Viton™ and Kalrez™.

A second aspect of the invention provides a system comprising: a vacuum pump having an exhaust; and a pair of abatement systems teed into the exhaust and a valve as described herein positioned upstream of each of the abatement systems.

The Summary is provided to introduce a selection of concepts in a simplified form that are further described in the Detailed Description. This summary is not intended to identify key features or essential features of the claimed subject matter, nor is it intended to be used as an aid in determining the scope of the claimed subject matter.

BRIEF DESCRIPTION OF THE DRAWINGS

Preferred embodiments of the invention shall now be described, by way of example only, with reference to the accompanying drawings in which.

DETAILED DESCRIPTION

Figure 1:
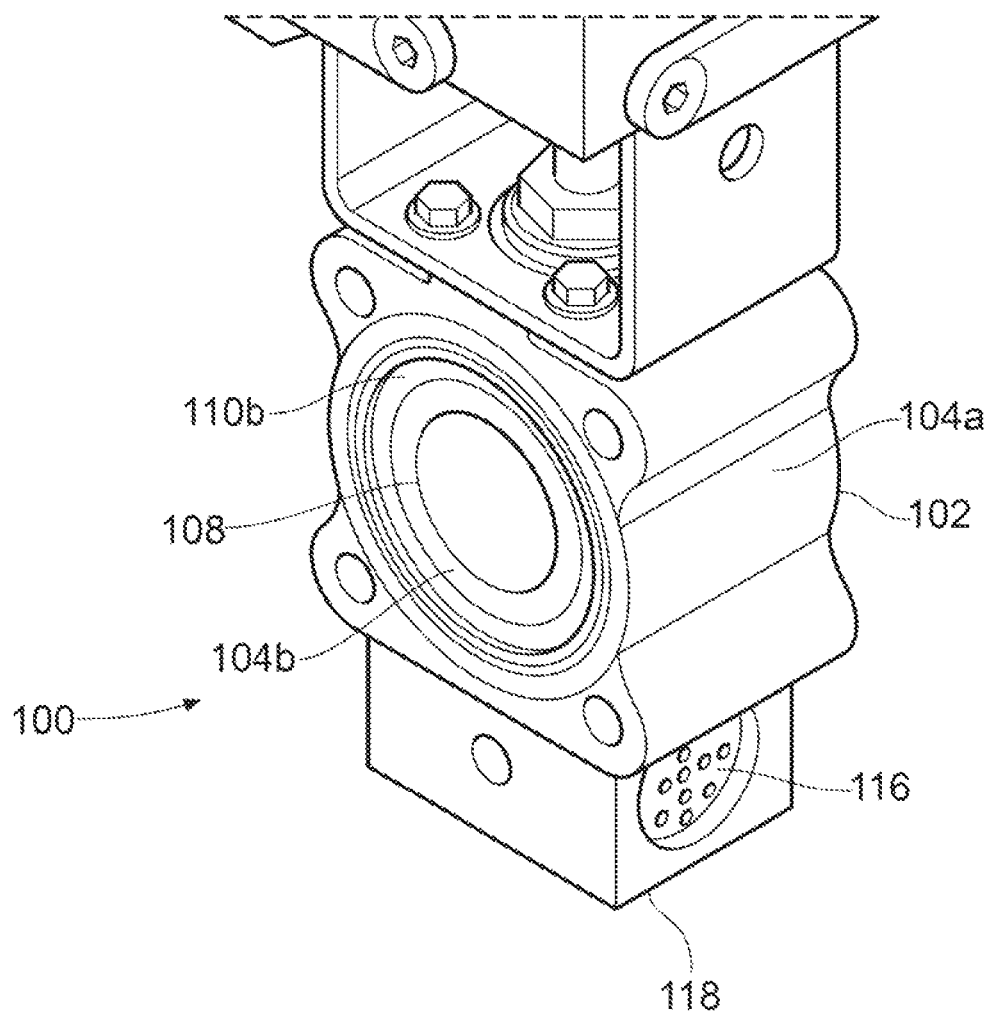
FIG. 1 is a schematic representation of a gas purged ball valve according to the present invention.

The isolation valve of the present invention may be a ball valve or a diverter valve. FIG. 1 shows an embodiment of a gas purged ball valve according to the present invention. The ball valve 100 has a housing 102 with an inlet 104a and an outlet 104b. The valve 100 further includes a rotatable ball 108 seated between a pair of valve seats 110a, 110b. The valve seats 110a, 110b are positioned in the inlet 104a and the outlet 104b of the valve 100, respectively.

Figure 2A:
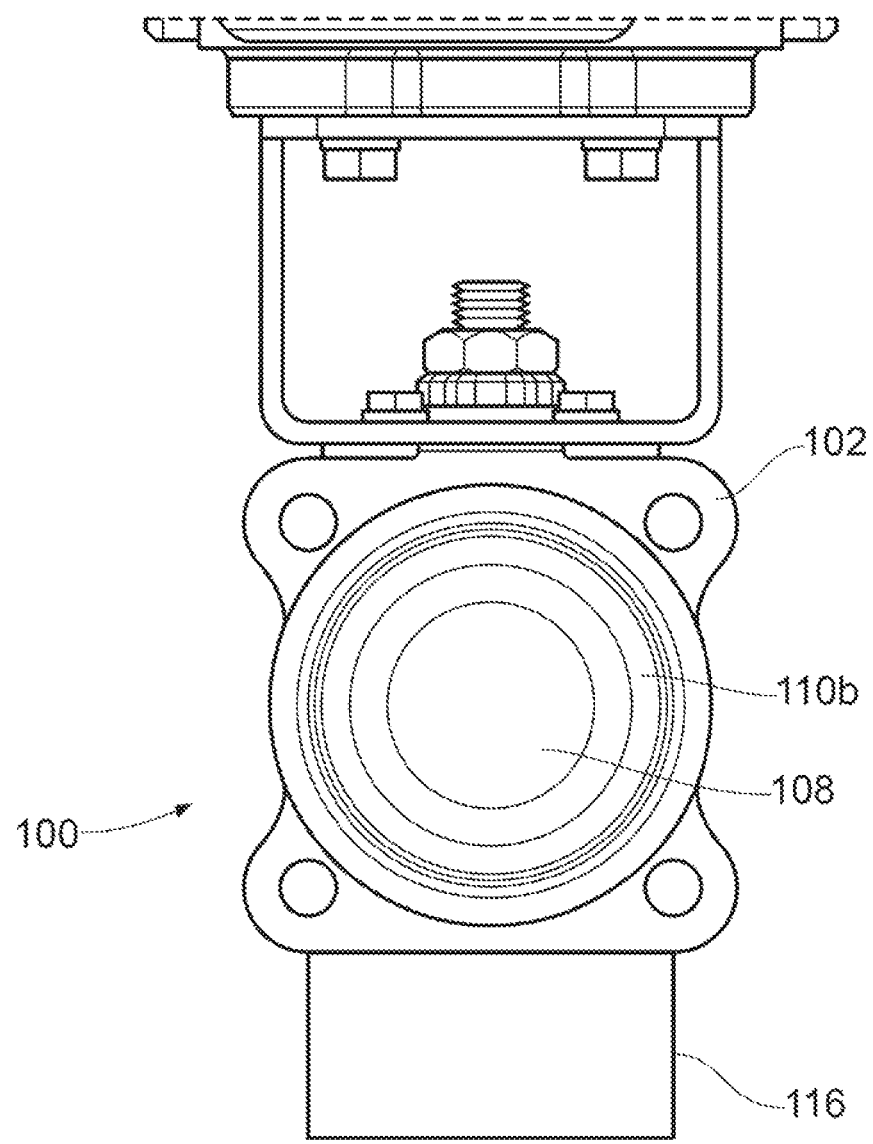
FIG. 2a is a side view of a gas purged ball valve (shown in the open position) according to the present invention.
Figure 2B:
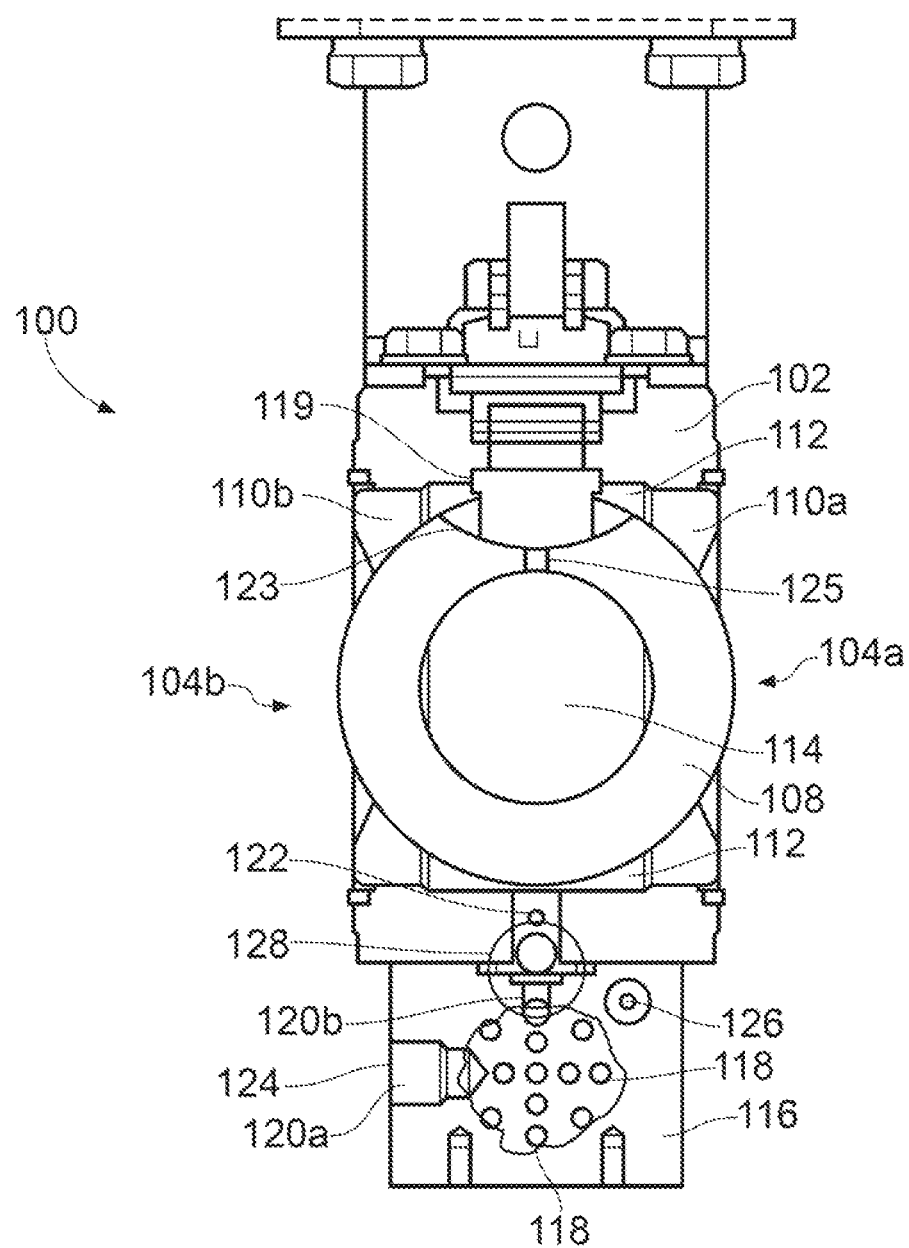
FIG. 2b is an end view of a gas purged ball valve (shown in the closed position) according to the present invention.

The ball 108 has a bore 114 through it, and the ball 108 may rotate between first and second positions. The bore 114 aligns with the inlet 104a and outlet 104b in the first position (See FIG. 2a) and misaligns or is perpendicular to the inlet 104a and outlet 104b in the second position (See FIG. 2b-2c). The aligning of the bore 114 with the inlet 104a and the outlet 104b forms the "open" process flow path through the valve 100. The ball 108 is spaced apart from the interior surface of the housing 102 to form a cavity 112 therein as shown in FIG. 1 and more particularly shown in FIGS. 2a-2c. The cavity 112, or "void" between the valve seats 110a, 110b and the housing 102, is purged with an inert gas as will be discussed in further detail below. As shown in FIG. 2b, the ball 108 further includes a key slot 123 that engages with the drive dog 119 of the valve 100. A small opening 125 in the ball 108 proximate the key slot 123 enables the bore 114 to be in fluid communication with the cavity 112.

Close coupled to the housing 102 is a manifold 116 having a flow path 118 with an inlet 120a and an outlet 120b. A pressurized source of inert gas 124, for example nitrogen, argon or helium, is connected to the manifold inlet 120a. The outlet 120b of the manifold 116 is in fluid communication with a port 122 in the housing 102 as shown in FIG. 2b. The port 122 passes through the housing 102 and into the cavity 112 thus connecting the flow path 118 with the cavity 112. Thus, the manifold 116 enables the cavity 112 to fill with the inert purge gas. While the manifold 116 can be constructed of a variety of solid materials, it is preferably constructed of a material having a high thermal conductivity such as aluminum alloy or copper.

A one-way (non-return) valve 128 is positioned in the port 122 so that inert gas can flow from the manifold 116 into the cavity 112, but not in the reverse direction. In one embodiment, a spring (not shown) is positioned in the port 122 between the ball (not shown) of the non-return valve 128 and the ball 108 of the isolation valve 100. The spring establishes a minimum pressure at which the purge gas must enter the port 122 and cavity 112.

Certain process steps require heat to prevent the formation of solid by-products in the pipework and components (e.g. valves, vacuum pumps, etc.) downstream from the process tool. For example, the condensable solid, aluminum chloride ($Al_2Cl_6$) is a by-product of an aluminum etch process. In another example, ammonium hexaflurosilicate (($NH_4$)$_2SiF_6$)) is a condensable by-product of a silicon nitride chemical vapor deposition process using a fluorine-based chamber clean. Accordingly, the purge gas supplied to the cavity 112 is preferably heated in order to minimize condensation within the ball 108 and housing 102 of the valve 100.

Figure 2C:
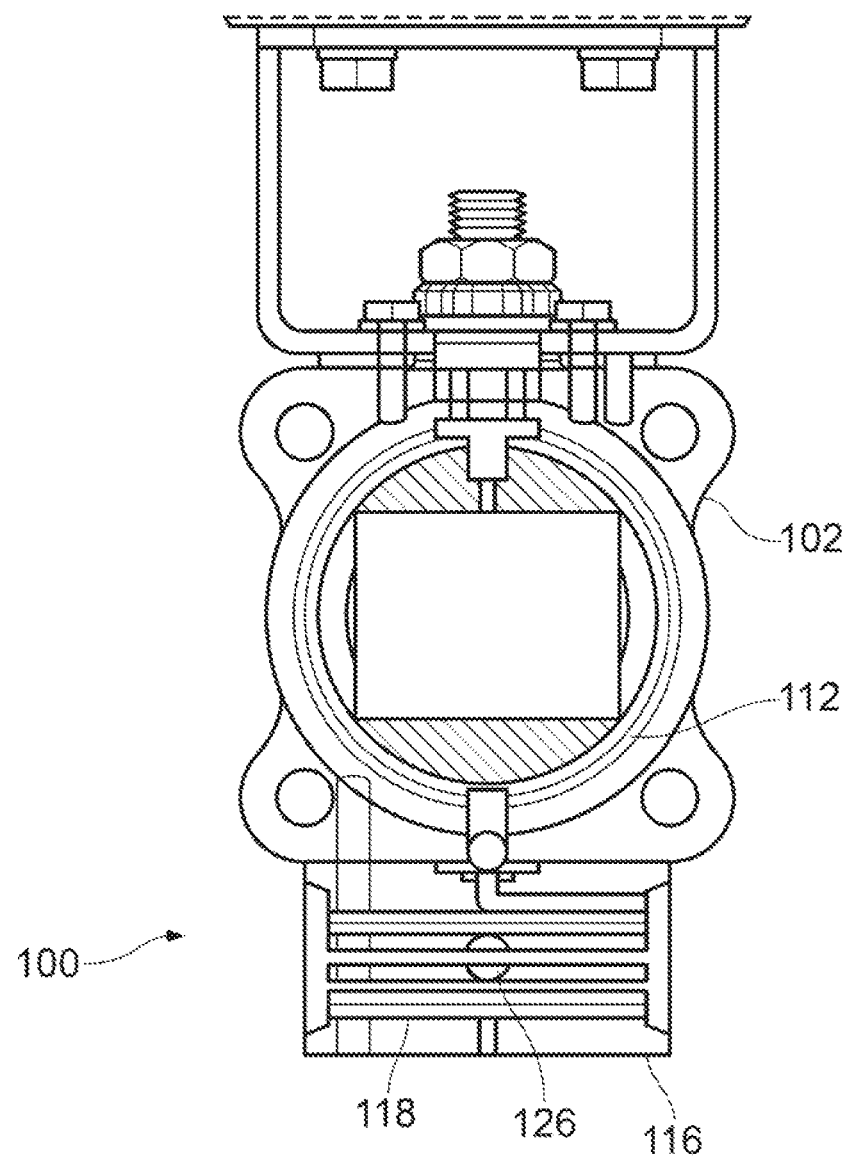
FIG. 2c is a side view of a gas purged ball valve (shown in the closed position) according to the present invention.

As shown in FIGS. 2b and 2c, the manifold 116 includes a heater 126, for example a cartridge heater, that is sized to maintain the temperature of the purge gas so as to minimize condensation within the ball 108 and housing 102 of the valve 100. The heater 126 should maintain the temperature of the purge gas at or above about 90° C., and preferably at or above about 120° C. If the manifold 116 is constructed of a material having a high thermal conductivity, such as aluminum alloy or copper, then the heater 126 can be positioned at any convenient location within the manifold 116. However, preferably the heater 126 is positioned closer to the manifold outlet 120b than to the manifold inlet 120a. As shown in FIGS. 2b and 2c, the heater 126 is positioned within the manifold 116 proximate the flow path 118 and the manifold outlet 120b.

In addition, the flow path 118 preferably optimizes heat transfer from the heater 126 to the purge gas flowing through the manifold 116. Thus, in one embodiment the flow path 118 is tortuous, where the purge gas must flow back-and-forth through the manifold 116 before it exits into port 122. In another embodiment the flow path 118 may include baffles to increase turbulence or may be a packed bed to enhance heat transfer.

As discussed above, the isolation ball valve 100 has a first position and a second position. FIG. 2a shows the valve 100 in the first "open" position and FIGS. 2b and 2c show the valve 100 in the second "closed" position. When the valve 100 is "open," process gas flows into the valve 100 through the valve inlet 104a, through the bore 114 of the ball 108 and out through the valve outlet 104b. See FIG. 2a. While the process gas flows through the "open" valve 100, heated purge gas flows from the manifold's 116 flow path 118 and into the cavity 112, thus heating the ball 108 and housing 102. From the cavity 112, the heated purge gas flows through the opening 125 into the bore 114 of the ball 108 where the heated purge gas combines with the process gas before exiting the valve 100. Preferably, the pressure of the heated inert gas supplied to the cavity 112 is higher than the normal maximum pressure of the process gas stream so that the inert gas can flow into the process gas stream.

When the ball valve 100 is "closed," as shown in FIGS. 2b and 2c, and there are no leaks in the valve 100, the heated purge gas continues to flow into the cavity 112 and bore 114 until the pressure of the purge gas inside the valve 100 reaches the pressure of the inert gas source 124. Thus, under normal circumstances, the purge gas is "dead-headed" by the "closed" valve 100. However, if the isolation valve 100 is damaged, for example from a scratch on the ball or a corroded valve seat and/or o-ring, harmless inert gas rather than the harmful process gas will leak from the cavity 112 and through the damaged area.

Figure 3A:
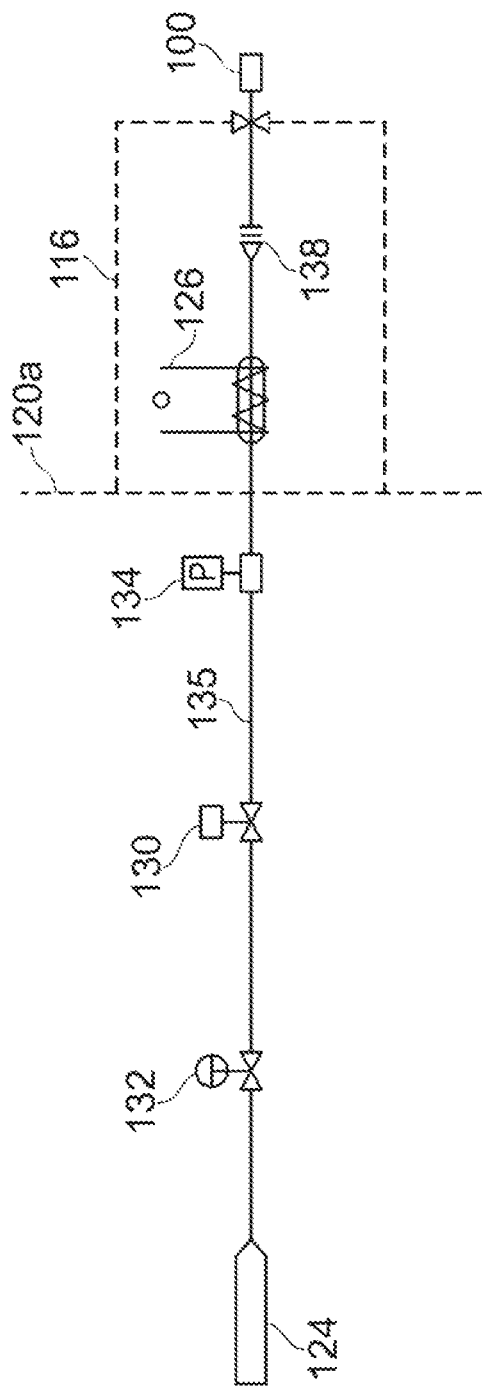
FIG. 3a is a schematic representation of a gas purged ball valve with purge gas pressure detection according to the present invention.

To detect a leak or damage in the isolation valve 100, pressure decay of the heated inert purge gas can be monitored. In one embodiment, a solenoid valve 130 is installed in the inert gas source line 135 upstream from the manifold inlet 120a together with a pressure regulator 132 to regulate the pressure to the manifold 116 as shown in FIG. 3a. A pressure transducer 134 is also positioned in the inert gas source line between the manifold inlet 120a and the solenoid valve 130 to monitor the pressure in the manifold 116. A heater 126 is positioned within the manifold 116, upstream of a check valve 138. Under normal operating conditions, the pressure of the inert gas should remain at a constant, pre-determined value.

As discussed above, the pressure of the heated inert gas in the cavity 112 should be higher than the maximum operating pressure of the process gas stream. The maximum pressure of the process gas stream is in turn determined by the characteristics of equipment, such as an abatement system, located downstream from the process chamber. For example, if the abatement system is a burner (e.g., See U.S. Pat. No. 7,494,633 issued to Stanton et al. and assigned to Edwards Limited) or a wet scrubber, then the pressure of the process gas stream may be about ±5 in $H_2O$ (or about ±0.181 psi, or 0.012 Bar). If, however, the abatement system is a gas reactor column (e.g., See U.S. Pat. No. 5,538,702 issued to Smith et al. and U.S. Publication No. 2005/0217732 A1 by Martin Ernst Tollner), then the pressure of the process gas stream may be as high as about 3.5 psi (i.e. about 0.24 Bar). Thus, in the former example, the pressure of the purge gas supplied to the valve 100 should be about 1 to about 5 psi (i.e. about 0.07 to 0.34 Bar). In the latter example, the pressure of the purge gas supplied to the valve 100 should be about 5 to about 15 psi (i.e. about 0.34 to 1.03 Bar).

During operation, shortly after the isolation (ball) valve 100 is rotated to the second "closed" position and the pressure of the heated inert gas in the valve 100 has had a chance to dead-head, then the solenoid valve 130 is also "closed." Thus, the cavity 112 becomes charged with the inert gas at a certain pressure as discussed in the preceding paragraph. Thus, if there are no leaks in the valve the pressure of the inert gas measured by the pressure transducer 134 will remain constant. If, however, the pressure transducer 134 measures a decay (or a decrease) in the pressure of the inert gas, then such decay is an indication that there is a leak in the isolation valve 100.

Figure 3B:
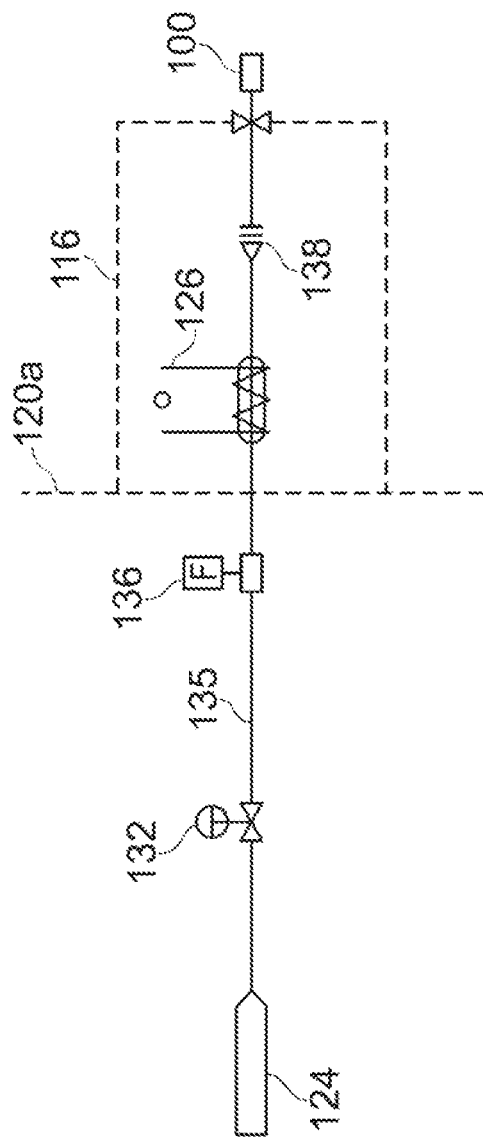
FIG. 3b is a schematic representation of a gas purged ball valve with flow rate purge gas detection according to the present invention.

In another embodiment, a flow transducer 136 is positioned in the purge gas line 135 to monitor the flow rate of the purge gas as shown in FIG. 3b. A pressure regulator 132 is also positioned in the purge gas line 135, upstream of the flow transducer 136. A heater 126 is positioned within the manifold 116 upstream of a check valve 138. Under normal circumstances, the purge gas is dead-headed within the cavity 112 as discussed above with respect to measuring pressure decay. However, if the flow transducer 136 detects flow of the purge gas, then such flow is an indication that there is a leak in the isolation valve 100. Notably, both flow and pressure decay of the purge gas line 135 can be monitored in order to detect failure of the isolation valve 100. To accomplish this, the flow transducer 136 could be installed between the pressure transducer 134 and the manifold inlet 120a.

Figure 4A:
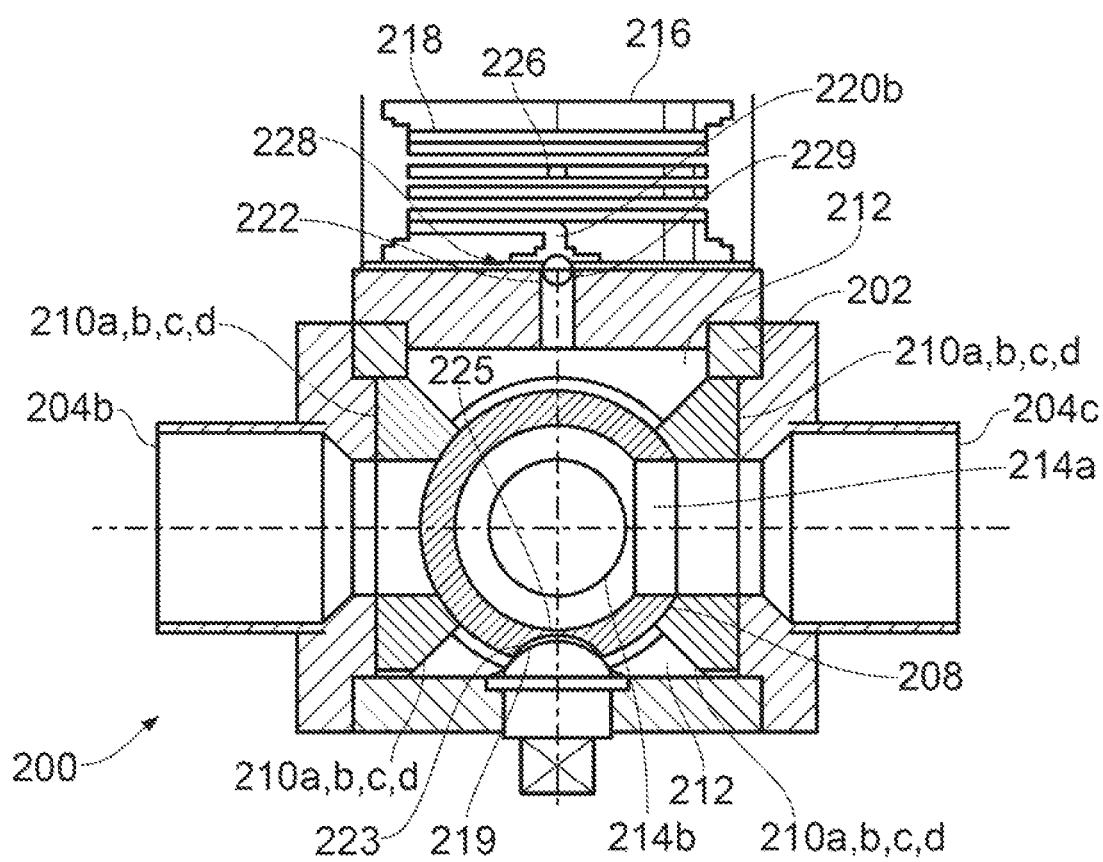
FIG. 4a is a section view of a diverter valve according to the present invention.

In another embodiment, the isolation valve is a diverter valve 200 as shown in FIG. 4a. In this embodiment, the diverter valve 200 has a housing 202 with an inlet 204a (shown in FIG. 5) and two outlets 204b and 204c. The diverter valve 200 also has a rotatable ball 208 seated between valve seats 210a, 210b, 210c, 210d. The valve seats 210a, 210b, 210c, 210d are positioned about the ball 208 as shown in FIG. 4.

Figure 5:
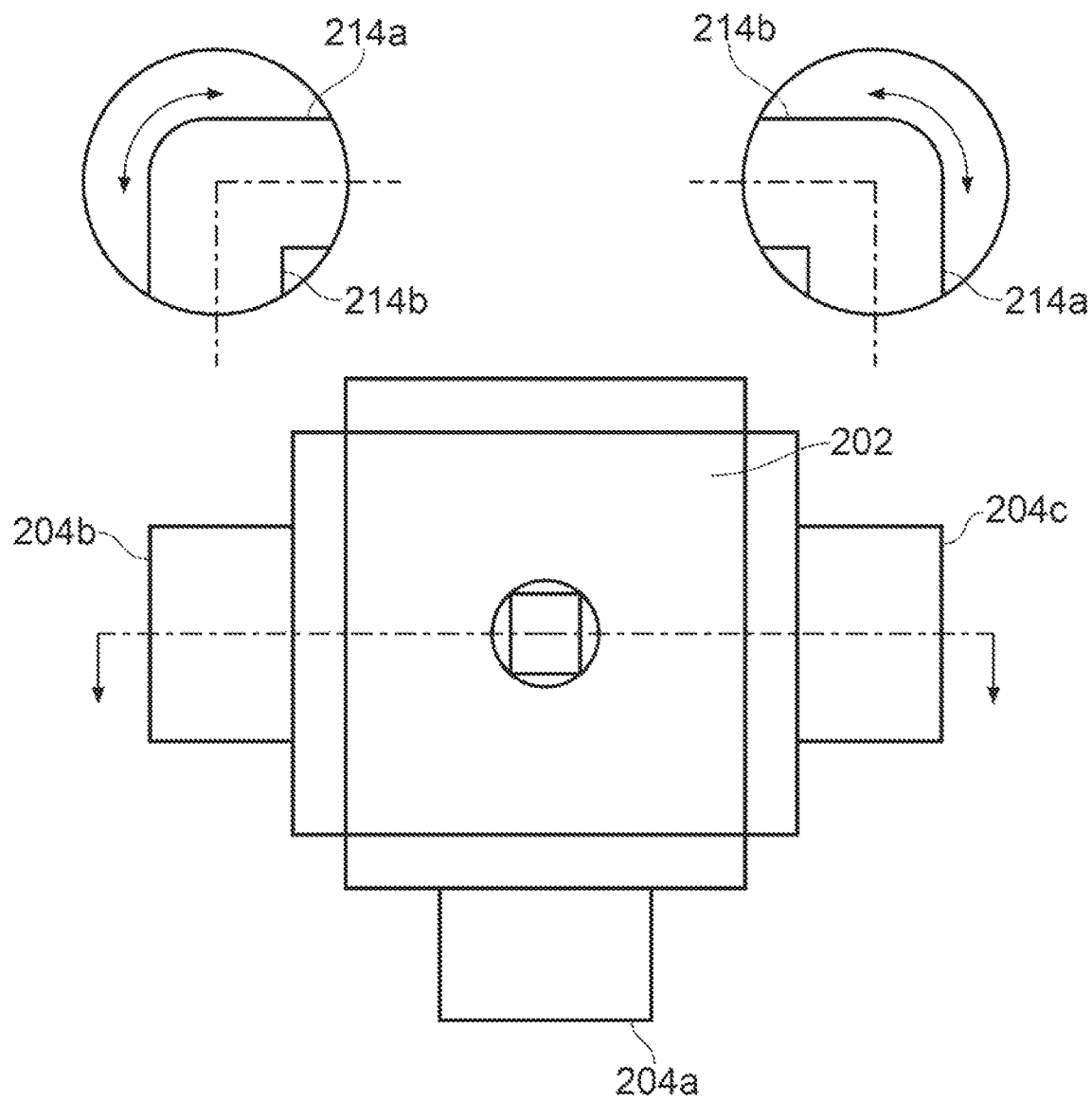
FIG. 5 is a plan view of a diverter valve according to the present invention.

The ball 208 has a bore with two limbs 214a, 214b that are arranged to form a single "L" configuration as illustrated in FIG. 5. Notably, the bores 214a, 214b are positioned within the plane represented by the horizontal dashed line in FIG. 4a. However, the axis of rotation of the ball 208, represented by the vertical dashed line in FIG. 4a, is perpendicular to this plane. This perpendicular configuration is necessary to isolate the cavity 212 (described below) from the process fluid flow path through the bores 214a, 214b of the valve 200.

The ball 208 is rotatable between a first position and a second position. In the first position, bore 214a aligns with the inlet 204a and bore 214b aligns with the outlet 204b. In this first position, the process gas flows from inlet 204a and through outlet 204b. In the second position, as shown in FIG. 4a, the ball 208 is rotated so that bore 214b aligns with inlet 204a and bore 214a aligns with outlet 204c. In this second position, process gas flows from inlet 204a and through outlet 204c.

The ball 208 is spaced apart from the interior surface of the housing to form a cavity 212 therein as shown in FIG. 4a. The cavity 212 is purged with an inert gas as will be described in detail below. As shown in FIG. 4a, the ball 208 includes a key slot 223 that engages with the drive dog 219 of the valve 200. A small opening 225 in the ball 208 proximate the key slot 223 enables the cavity 212 to be in fluid communication with the bores 214a, 214b. The small opening 225 must be sized so as to provide the necessary pressure drop thus allowing the cavity 212 to operate at a higher pressure than the process fluid flow.

Figure 4B:
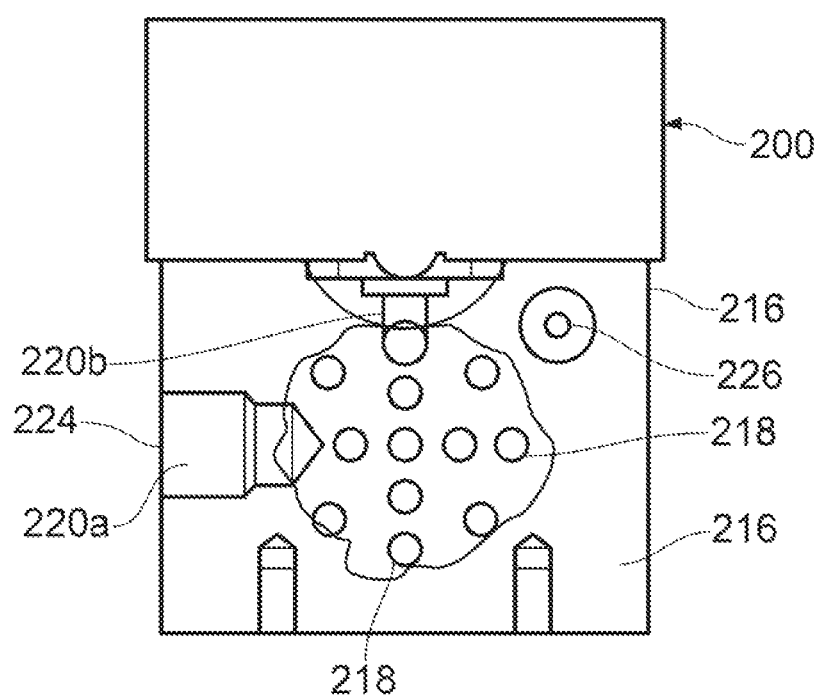
FIG. 4b is a view of a manifold coupled to a diverter valve according to the present invention.

As shown in FIGS. 4a and 4b, close coupled to the housing 202 is a manifold 216 having a flow path 218 with an inlet 220a and an outlet 220b. A pressurized source of inert gas 224, for example nitrogen, argon or helium, is connected to the manifold inlet 220a. The outlet 220b of the manifold 216 is in fluid communication with a port 222 in the housing 202 as shown in FIG. 4. The port 222 passes through the valve housing 202 and into the cavity 212 thus connecting the flow path 218 with the cavity 212. Thus, the manifold 216 enables the cavity 212 to fill with pressurized inert purge gas. While the manifold 216 can be constructed of a variety of solid materials, it is preferably constructed of a material having a high thermal conductivity such as aluminum alloy or copper.

A one-way (non-return) valve 228 is positioned in the port 222 so that inert gas can flow from the manifold 216 into the cavity 212, but not in the reverse direction. In one embodiment, a spring (not shown) is positioned in the port 222 between the ball 229 of the non-return valve 228 and the ball 208 of the isolation valve 200. The spring establishes a minimum pressure at which the purge gas must enter the port 222 and cavity 212.

As shown in FIG. 4b, the manifold 216 preferably includes a heater 226, for example a cartridge heater, which is sized to maintain the temperature of the purge gas so as to minimize condensation within the ball 208 and housing 202 of the valve 200. The heater 226 should maintain the temperature of the purge gas at or about 90° C., and preferably above about 120° C. If the manifold 216 is constructed of a material having a high thermal conductivity, such as aluminum alloy or copper, then the heater 226 can be positioned at any convenient location within the manifold 216. However, preferably the heater 226 is positioned closer to the manifold outlet 220b than to the manifold inlet 220a. As shown in FIG. 4b, the heater 226 is positioned within the manifold 216 proximate the flow path 218 and the manifold outlet 220b.

In addition, the flow path 218 preferably optimizes heat transfer from the heater 226 to the purge gas flowing through the manifold 216. Thus, in one embodiment the flow path 218 is tortuous as shown in FIG. 4a, where the purge gas must flow back-and-forth through the manifold 216 before it exits into port 222. In another embodiment the flow path 218 may include baffles to increase turbulence or may be a packed bed to enhance heat transfer.

As discussed above, the isolation diverter valve 200 has a first position and a second position. When bores 214a and 214b are aligned with inlet 204a and outlet 204b, respectively, process gas flows into the valve 200 through the inlet 204a, through the bores 214a, 214b of the ball 208 and out through outlet 204b. While the process gas flows through the bores 214a, 214b, heated purge gas flows from the manifold's 216 flow path 218 and into the cavity 212, thus heating the ball 208 and housing 202. From the cavity 212, the heated purge gas flows through the opening 225 into the bores 214a, 214b of the ball 208 where the heated purge gas combines with the process fluid before exiting the valve 200. Preferably, the pressure of the heated inert gas supplied to the cavity 212 is higher than the normal maximum pressure of the process gas stream so that the inert gas can flow into the process gas stream.

Similarly, when bores 214a and 214b are aligned with outlet 204c and inlet 204a, respectively, process gas flows into inlet 204a and through outlet 204c. See FIG. 4a. As in the first position, heated inert purge gas flows into the bores 214a, 214b to combine with the process fluid. Moreover, the pressure of the inert purge gas is preferably higher than the operating pressure of the process gas.

Thus, during operation, when the valve 200 is in either the first or second position, the heated inert purge gas flows constantly into the cavity and bores 214a, 214b. As discussed above, the port 222 is sized to ensure that the pressure of the purge gas exceeds the pressure of the process gas and to control the flow of the purge gas into the bores 214a, 214b. Should the valve 200 fail, for example, from corrosion of a valve seat, the flow rate of the inert purge gas will increase. Thus, using the same configuration shown in FIG. 3b, a flow transducer can be positioned in the purge gas line to monitor the flow rate of the purge gas. If the flow transducer detects a relative increase in flow rate, then this would be an indication of a valve failure.

The wetted components of the isolation valve 100, 200, such as the housing, ball 108, 208, and valve seats 110a, 110b, must be compatible with gases such as fluorine, chlorine, hydrogen bromide and other gases used in semiconductor, flat panel display and solar panel manufacturing processes. Similarly, the wetted components of the non-return valve 128, 228, such as the ball 229, spring (not shown), washer (not shown) and sealing rings (not shown), must also be compatible with the aforementioned gases. Ball 108, 208, and ball 229 are preferably constructed of stainless steels (for example, 304L, 316L, etc.) that are corrosion resistant to the aforementioned gases. The spring (not shown) should be constructed out of an alloy having a high nickel content, or a Mnemonic material, such as those manufactured by Inco Alloys. The washer and sealing rings (not shown) should be constructed of stainless steels (e.g. 304L, 316L, etc.), Hastelloy, Viton® or Kalrez®. The manifold 116 can be constructed of a relatively inexpensive material such as aluminum.

Figure 6A:
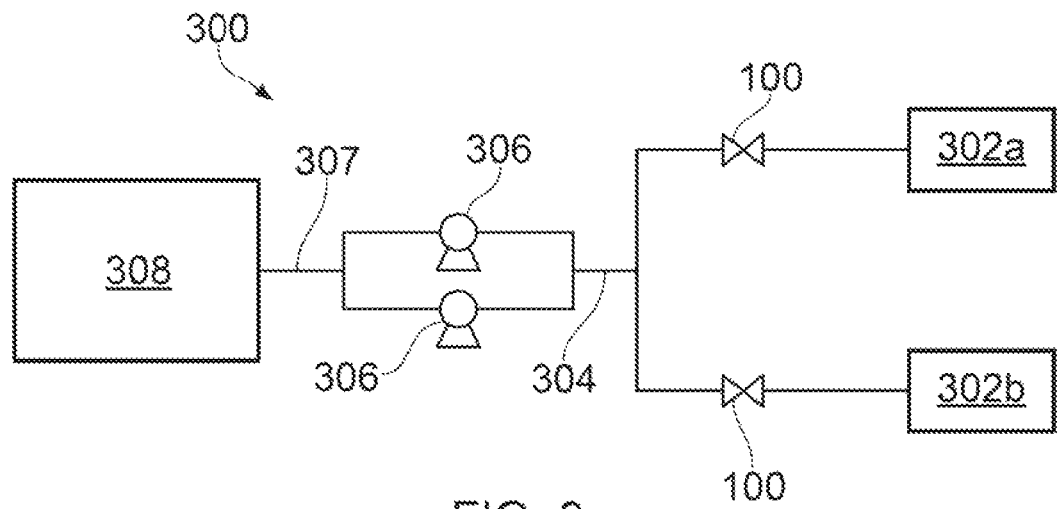
FIG. 6a is a schematic representation of a system having a pair of gas purged ball valves according to the present invention.
Figure 6B:
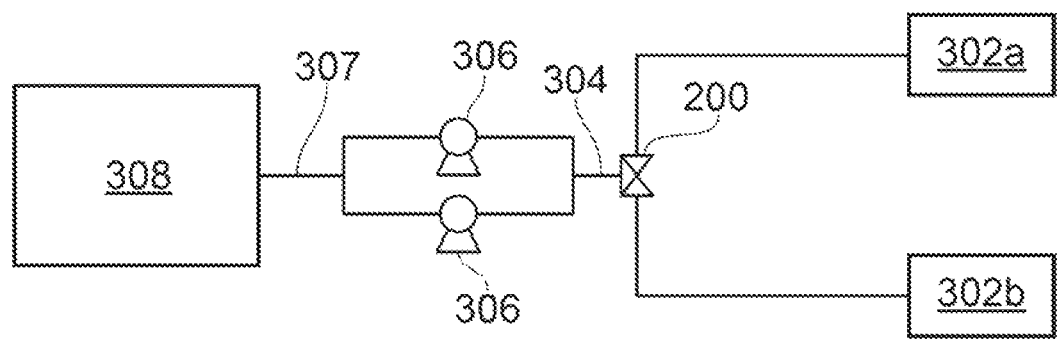
FIG. 6b is a schematic representation of a system having a gas purged diverter valve according to the present invention.

Also provided is a system 300 having an isolation valve 100, 200 according to the present invention. FIG. 6a shows a system 300 according to the present invention. The system 300 has redundant abatement systems 302a, 302b to receive an exhaust 304 from one or more vacuum pumps 306 connected to the outlet 307 of a process chamber 308. The exhaust line 304 tees into each abatement system 302a, 302b and in the embodiment shown in FIG. 6a, an isolation valve 100 is installed in each line of the tee. In another embodiment 301 shown in FIG. 6b, a diverter valve 200 according to the present invention is installed at the tee upstream from the abatement systems 302a, 302b. In both embodiments 300, 301, the isolation valves 100, 200 are constructed and function as described above.

The present invention as described above and shown in the embodiments of FIGS. 1-6b provides cost-effective redundancy and enhanced safety in semiconductor, solar panel and flat panel display processes. It is anticipated that other embodiments and variations of the present invention will become readily apparent to the skilled artisan in light of the foregoing description, and it is intended that such embodiments and variations likewise be included within the scope of the invention as set forth in the following claims.

Although elements have been shown or described as separate embodiments above, portions of each embodiment may be combined with all or part of other embodiments described above.

Although the subject matter has been described in language specific to structural features and/or methodological acts, it is to be understood that the subject matter defined in the appended claims is not necessarily limited to the specific features or acts described above. Rather, the specific features and acts described above are described as example forms of implementing the claims.

The invention claimed is:

1. A valve comprising:
   a housing with at least one inlet and at least one outlet;
   a valve member located within the housing and being moveable between different positions for controlling, in use, the flow of a fluid from an inlet to an outlet of the valve;
   at least two spaced-apart valve seats in which the valve member is seated so as to form a cavity bounded by the valve seats, an exterior surface of the valve member and an interior surface of the housing;
   a first conduit extending between the exterior of the housing and the cavity; and
   a second conduit extending between the cavity and a bore of the valve member, through which conduits, in use, a purge gas can be introduced into the cavity and bore
   wherein the valve member is rotatable between first and second positions such that the bore does not align with either the inlet or the outlet in the second position and the purge gas is dead-headed when the valve member is in the second position.

2. The valve as claimed in claim 1, wherein a pressurized purge gas can be introduced into the cavity and bore.

3. The valve as claimed in claim 1, wherein the bore aligns with the inlet and the outlet in the first position.

4. The valve as claimed in claim 1, further comprising a non-return valve for inhibiting or preventing egress of purge gas from the housing via the first conduit.

5. The valve as claimed in claim 1, further comprising a manifold through which, in use, the purge gas is introduced into the purge gas conduit from outside the housing, and further comprising a heater for heating the purge gas within the manifold prior to entering the cavity.

6. The valve as claimed in claim 5, wherein the manifold comprises means for increasing turbulence of the purge gas flowing through it; and/or wherein the manifold comprises a tortuous flow path for purge gas flowing through it; and/or wherein the manifold comprises a flow path for purge gas flowing through it, the flow path comprising baffles; and/or wherein the manifold comprises a flow path for purge gas flowing through it, the flow path comprising a packing material; and/or further comprising a purge gas supply connected to an inlet of the manifold.

7. The valve of claim 1, further comprising means for monitoring the pressure or flow of the purge gas in the cavity and/or in the first conduit, and/or in the second conduit, and/or in the manifold.

8. The valve as claimed in claim 7, further comprising means for monitoring the pressure or flow of the purge gas in a purge gas supply.

9. The valve of claim 8, wherein the means for monitoring the pressure of the purge gas in the purge gas supply comprises a pressure transducer positioned within the purge gas supply and wherein a valve and a pressure regulator are provided upstream of the pressure transducer along with a valve for isolating the purge gas within the cavity and the manifold, the pressure transducer being adapted to monitor the pressure of the isolated purge gas.

10. The valve of claim 7, wherein the means for monitoring the flow of the purge gas comprises a flow transducer.

11. The valve of claim 10, wherein the flow transducer is positioned within a purge gas supply for monitoring the flow rate of the purge gas.

12. The valve of claim 1, wherein at least one component of the valve is compatible with gases selected from the group consisting of: fluorine; chlorine; and hydrogen bromine.

13. A system comprising: a vacuum pump having an exhaust; and a pair of abatement systems teed into the exhaust; wherein a valve is positioned upstream from each of the abatement systems, the valve comprising:
   a housing with at least one inlet and at least one outlet;
   a valve member located within the housing and being moveable between different positions for controlling, in use, the flow of a fluid from an inlet to an outlet of the valve;
   at least two spaced-apart valve seats in which the valve member is seated so as to form a cavity bounded by the valve seats, an exterior surface of the valve member and an interior surface of the housing;

a first conduit extending between the exterior of the housing and the cavity; and a second conduit extending between the cavity and a bore of the valve member, through which conduits, in use, a purge gas can be introduced into the cavity and bore.

14. A gas isolation valve comprising:

a housing comprising an inlet, a first outlet and a second outlet;

a valve member located within the housing and being moveable between first and second positions for controlling, in use, the flow of a fluid through the valve;

wherein the valve member is rotatable between said first and second positions such that a bore aligns with the inlet and the first outlet in the first position and the bore aligns with the inlet and the second outlet in the second position;

at least three spaced-apart valve seats in which the valve member is seated so as to form a cavity bounded by the valve seats, an exterior surface of the valve member and an interior surface of the housing;

a first conduit extending between the exterior of the housing and the cavity; and a second conduit extending between the cavity and the bore of the valve member, such that, in use, a purge gas can be introduced through the first conduit into the cavity and then through the second conduit into the bore.

* * * * *